(12) United States Patent
Park

(10) Patent No.: US 7,696,776 B2
(45) Date of Patent: Apr. 13, 2010

(54) CIRCUIT FOR GENERATING ON-DIE TERMINATION CONTROL SIGNAL

(75) Inventor: Nak Kyu Park, Ichon (KR)

(73) Assignee: Hynix Semiconductor Inc. (KR)

( * ) Notice: Subject to any disclaimer, the term of this patent is extended or adjusted under 35 U.S.C. 154(b) by 46 days.

(21) Appl. No.: 12/026,402

(22) Filed: Feb. 5, 2008

(65) Prior Publication Data

US 2008/0309368 A1 Dec. 18, 2008

(30) Foreign Application Priority Data

Jun. 13, 2007 (KR) .................. 10-2007-0057582

(51) Int. Cl.
*H03K 17/16* (2006.01)
*H03K 19/003* (2006.01)
*H03K 3/00* (2006.01)

(52) U.S. Cl. .................. 326/30; 327/108; 326/82

(58) Field of Classification Search .................. 326/26, 326/30, 86, 87; 327/108, 109; 333/17.3, 333/32; 365/189.05, 189.11, 198.51, 202, 365/225

See application file for complete search history.

(56) References Cited

U.S. PATENT DOCUMENTS

| | | | |
|---|---|---|---|
| 6,958,613 B2 | 10/2005 | Braun et al. | |
| 6,980,020 B2 | 12/2005 | Best et al. | |
| 7,145,815 B2 | 12/2006 | Janzen | |
| 7,151,390 B2 | 12/2006 | Nguyen et al. | |
| 7,170,313 B2 | 1/2007 | Shin | |
| 7,176,711 B2 | 2/2007 | Park et al. | |
| 7,365,564 B2 * | 4/2008 | Kim | 326/30 |
| 7,456,651 B2 * | 11/2008 | Lee | 326/30 |
| 2007/0146004 A1* | 6/2007 | Park et al. | 326/30 |
| 2007/0234248 A1* | 10/2007 | Yamamoto | 716/5 |
| 2007/0236248 A1* | 10/2007 | Park | 326/30 |
| 2008/0042684 A1* | 2/2008 | Kim | 326/16 |
| 2008/0224728 A1* | 9/2008 | Park | 326/30 |
| 2009/0102510 A1* | 4/2009 | Park | 326/30 |

FOREIGN PATENT DOCUMENTS

| | | |
|---|---|---|
| JP | 2005-285125 | 10/2005 |
| JP | 2006-129423 | 5/2006 |
| KR | 1020050001167 A | 1/2005 |

* cited by examiner

*Primary Examiner*—Vibol Tan
*Assistant Examiner*—Dylan White
(74) *Attorney, Agent, or Firm*—Baker & McKenzie LLP

(57) ABSTRACT

A circuit for generating an on-die termination control signal can include a first signal generation block configured to generate a first signal to prevent a first on-die terminal control from being performed in a frequency/voltage switching period, a second signal generation block configured to generate a second signal to perform a second on-die termination control at an initial stage of operation, and a signal output block configured to generate the on-die termination control signal by combining the first and second signals.

23 Claims, 5 Drawing Sheets

CIRCUIT FOR GENERATING ON-DIE TERMINATION CONTROL SIGNAL

CROSS-REFERENCES TO RELATED APPLICATION

The present application claims the benefit under 35 U.S.C. 119(a) of Korean application number 10-2007-0057582, filed on Jun. 13, 2007, in the Korean Intellectual Property Office which is incorporated by reference in its entirety as if set forth in full.

BACKGROUND

1. Technical Field

The disclosures herein relate to a semiconductor memory apparatus and, more particularly, to a circuit for generating an on-die termination control signal to operate an on-die termination circuit of a semiconductor memory apparatus.

2. Related Art

Conventional on-die termination control refers to an operation which allows a driver to have impedance identical to a reference impedance regardless of PVT (process, voltage and temperature) fluctuations. In order to perform the on-die termination control, an on-die termination circuit is provided in a semiconductor memory apparatus. In addition, a circuit for generating an on-die termination control signal is provided in the semiconductor memory apparatus in order to allow the on-die termination circuit to perform the on-die termination control.

As shown in FIG. 1, an exemplary circuit for generating an on-die termination control signal includes a first pulse generator 11, a first NOR gate NR1, a first inverter IV1, a second inverter IV2, a NAND gate ND1, a third inverter IV3, an oscillator 12, a second pulse generator 13, a counter 14, a second NOR gate NR2 and a fourth inverter IV4.

Hereinafter, the operation of the conventional circuit for generating the on-die termination control signal will be described with reference to FIGS. 1 and 2.

When an auto-refresh pulse signal (AREFP) is generated according to an auto-refresh command or a self-refresh signal (SREF) is deactivated, a first internal signal (INT_CALP1) is generated through the first NOR gate NR1 and the first inverter IV1. The first internal signal (INT_CALP1) is output as an on-die termination control signal (ODT_CALP) through the second NOR gate NR2 and the fourth inverter IV4.

Meanwhile, if a system stabilizing signal (RES) is activated and a counting limit signal (CAL_MAX) is deactivated, then an oscillator enable signal (OSC_EN) is activated through the first NAND gate ND1 and the third inverter IV3. The system stabilizing signal (RES) is used to notify a semiconductor memory device of the stable operation of the system, that is, to notify the situation that a GPU (graphic processing unit) or a CPU (central processing unit) stably outputs clock signals. In addition, the counting limit signal (CAL_MAX) is activated when the counter 14 counts to a predetermined number. In the initial operation, the counting limit signal (CAL_MAX) is deactivated in a low level. As the oscillator enable signal (OSC_EN) is activated, the oscillator 12 generates a control signal generating clock (CAL_CLK).

The second pulse generator 13 is activated according to the system stabilizing signal (RES) and generates a pulse, that is, the second internal signal (INT_CALP2) by using the control signal generating clock (CAL_CLK). The second internal signal (INT_CALP2) is output as an on-die termination control signal (ODT_CALP) through the second NOR gate NR2 and the fourth inverter IV4.

Meanwhile, the counter 14 counts the number of second internal signals (INT_CALP2) of the second pulse generator 13, that is, the generating number of pulses by using the control signal generating clock (CAL_CLK). The counter 14 activates the counting limit signal (CAL_MAX) in a high level when the count value reaches a predetermined level (for example, 30 times).

As the counting limit signal (CAL_MAX) is activated in a high level, the oscillator enable signal (OSC_EN) is deactivated, so that the operation of the oscillator 12 is stopped and the second pulse generator 13 does not generate the second internal signal (INT_CALP2).

In a conventional semiconductor memory apparatus, a frequency/voltage switching (FVS) period exists in a self-refresh period where the self-refresh signal (SREF) is activated. The FVS period is for switching voltage or frequency to save power consumption according to the operational mode change. Since the voltage or the frequency is switched in the FVS period, the voltage or the frequency is unstable in the FVS period.

In a first case (case 1) illustrated in FIG. 2, the on-die termination control signal (ODT_CALP) can be generated according to the auto-refresh command generated in the FVS period (A). Since the voltage or the frequency is unstable in the FVS period, the toggling of the system stabilizing signal (RES) may occur. Due to the toggling of the system stabilizing signal (RES), the on-die termination control signal (ODT_CALP) is generated several times (B).

In a second case (case 2), the on-die termination control signal (ODT_CALP) can be generated according to the auto-refresh command generated in the self-refresh period (C). If the second case exists, then it is not the self-refresh mode since the clock enable signal CKE is activated. But, an internal circuit of the semiconductor apparatus maintains a self-refresh mode.

In a third case (case 3), as indicated by "D", the on-die termination control signal (ODT_CALP), which is generated according to the auto-refresh command, may collide with the on-die termination control signal (ODT_CALP), which is generated when the self-refresh period ends. In this case, the on-die termination enable signal (ODT_EN) is activated when the self-refresh period ends. Accordingly, the on-die termination circuit, which performs the on-die termination control, operates so that a supply voltage VDDQ can be temporarily dropped (E).

In a fourth case (case 4), the on-die termination control signal (ODT_CALP) is generated one time according to the auto-refresh command (F). However, since the self-refresh period ends and the supply voltage VDDQ is stabilized after being temporarily dropped, it is necessary to perform the on-die termination control several times as represented in "B".

However, a conventional circuit for generating the on-die termination control signal has the following problems: First, since the on-die termination control signal is generated in the self-refresh period including the FVS period to perform the on-die termination control, the accuracy of the on-die termination control is significantly lowered. Second, the on-die termination control signal caused by the auto-refresh command may collide with the on-die termination control signal generated when the self-refresh period ends so that the on-die termination control cannot be performed or the accuracy thereof is significantly lowered. Third, since the on-die termination control signal is generated one time after the self-refresh period ends, the on-die termination control is performed one time so that the control result does not reflect actual voltage and frequency variation.

SUMMARY

A circuit for generating an on-die termination control signal capable of preventing a control error when an on-die termination control is performed in an abnormal operation period, such as a refresh period is described herein, as is a circuit for generating an on-die termination control signal capable of preventing a control error caused by a collision between an on-die termination control signal derived from the auto-refresh command and an on-die termination control signal generated when the self-refresh period ends. A circuit for generating an on-die termination control signal capable of performing an on-die termination control identical to that of an initialization process even if a self-refresh mode is changed to a normal mode is also described herein.

According to one aspect, a circuit for generating an on-die termination control signal comprises a first signal generation block for generating a first signal to prevent a first on-die terminal control from being performed in a frequency/voltage switching period, a second signal generation block for generating a second signal to perform a second on-die termination control at an initial stage of operation, and a signal output block for generating the on-die termination control signal by combining the first and second signals.

According to another aspect, a circuit for generating an on-die termination control signal comprises a first signal generation block for generating a first signal to perform a first on-die terminal control according to a self-refresh signal or an auto-refresh signal, a second signal generation block for generating a second signal to prevent a second on-die termination control from being performed in a frequency/voltage switching period and to perform the second on-die termination control after the frequency/voltage switching period ends, and a signal output block for generating the on-die termination control signal by combining the first and second signals.

According to still another aspect, a circuit for generating an on-die termination control signal comprises a first signal generation block for generating a first signal to prevent a first on-die termination control from being performed in a frequency/voltage switching period, a second signal generation block for generating a second signal to prevent a second on-die termination control from being performed in the frequency/voltage switching period and to perform the second on-die termination control after the frequency/voltage switching period ends, and a signal output block for generating the on-die termination control signal by combining the first and second signals.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
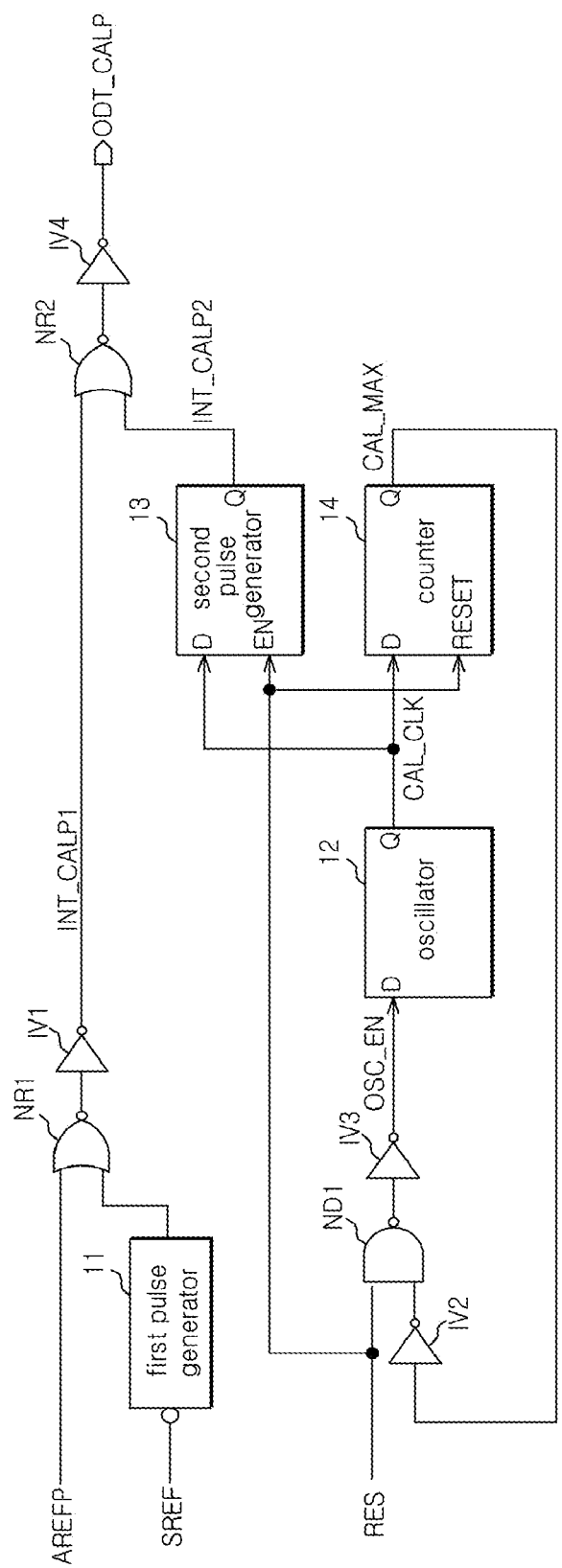
FIG. 1 is a block diagram illustrating an exemplary circuit for generating an on-die termination control signal.
Figure 2:
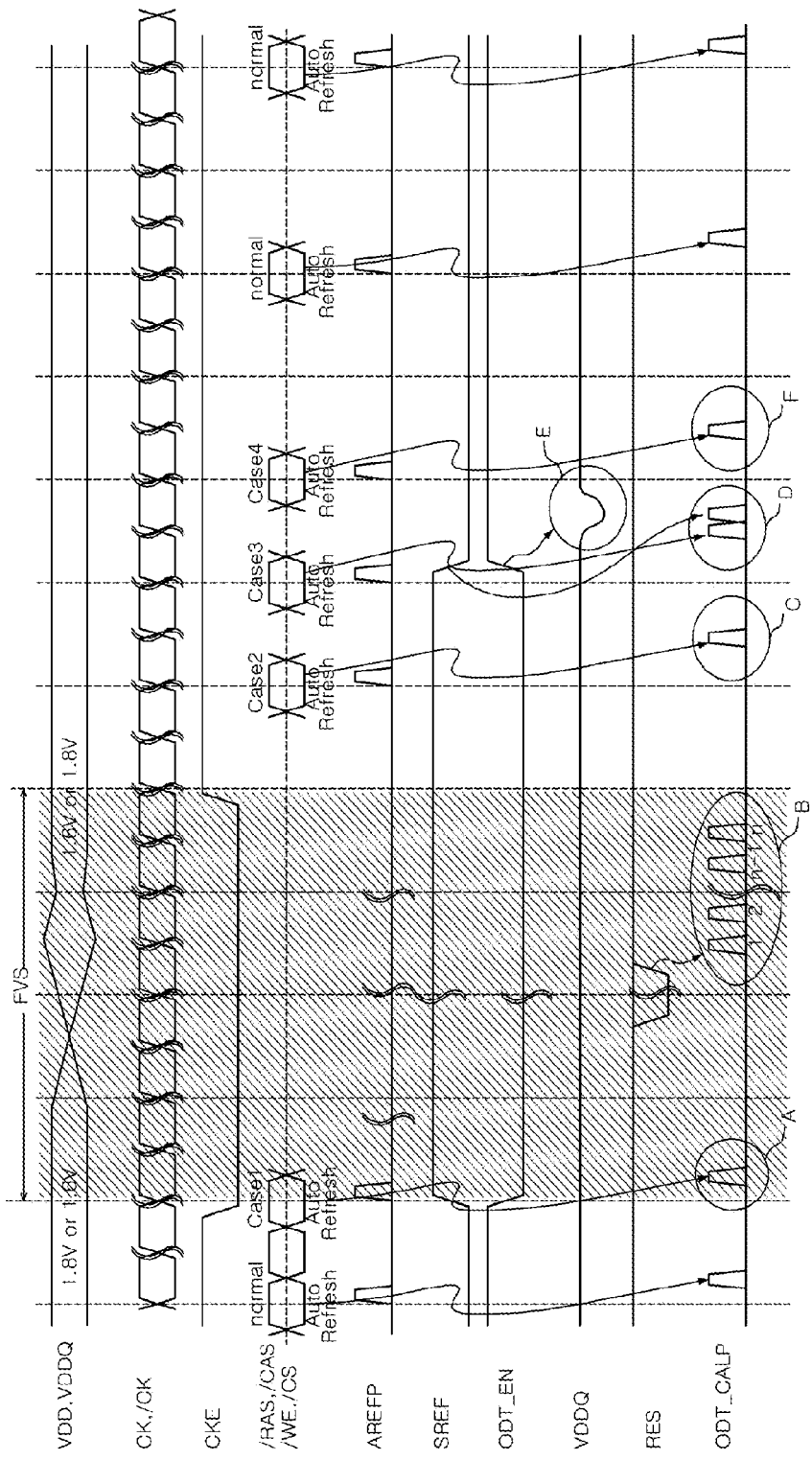
FIG. 2 is a timing diagram illustrating the operation of the circuit illustrated in FIG. 1.
Figure 3:
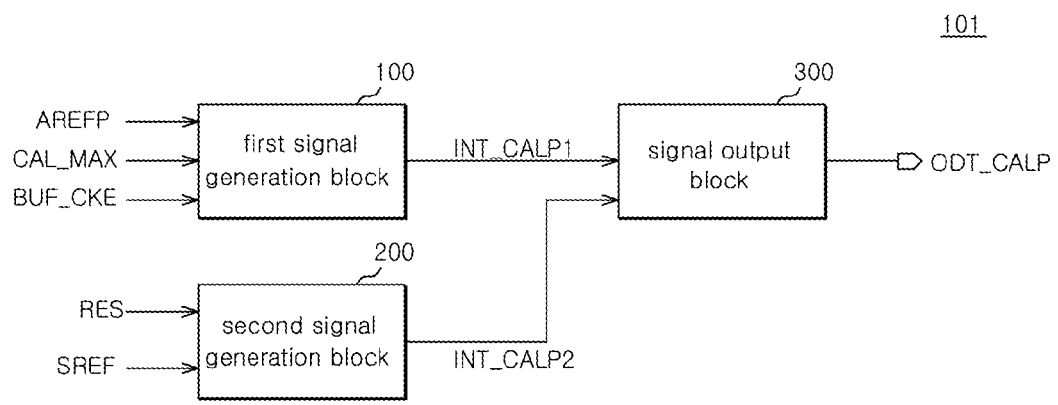
FIG. 3 is a block diagram illustrating a circuit configured to generate an on-die termination control signal according to one embodiment.

FIG. 3 is a block diagram illustrating an example circuit 101 configured to generate an on-die termination control signal according to one embodiment. Referring to FIG. 3, the circuit 101 can include a first signal generation block 100, a second signal generation block 200 and a signal output block 300.

The first signal generation block 100 can be configured to generate a first internal signal (INT_CALP1) configured to prevent a first on-die termination control from being performed in a frequency/voltage switching period. The first signal generation block 100 can generate the first internal signal (INT_CALP1) by detecting a self-refresh period and a predetermined time period after the termination of the self-refresh period by using a counting limit signal (CAL_MAX) and a clock enable signal (BUF_CKE).

The second signal generation block 200 can be configured to generate a second internal signal (INT_CALP2), which can perform the second on-die termination control, after the frequency/voltage switching period ends, and which can prevent a second on-die termination control from being performed in the frequency/voltage switching period.

In detail, the second signal generation block 200 can generate the second internal signal (INT_CALP2) by using a system stabilizing signal (RES) and a self-refresh signal (SREF). Further, if the system stabilizing signal (RES) is activated in a state in which the self-refresh signal (SREF) is deactivated, then the second signal generation block 200 can generate the second internal signal (INT_CALP2) by repeatedly generating pulses. When the number of pulses reaches a predetermined level, the second signal generation block 200 can stop the generation of the second internal signal (INT_CALP2).

The signal output block 300 can be configured to output an on-die termination control signal (ODT_CALP) by combining the first internal signal (INT_CALP1) with the second internal signal (INT_CALP2). The frequency/voltage switching period may be the self-refresh period. The frequency/voltage switching period may include the self-refresh period and the predetermined time period after the termination of the self-refresh period.

Figure 4:
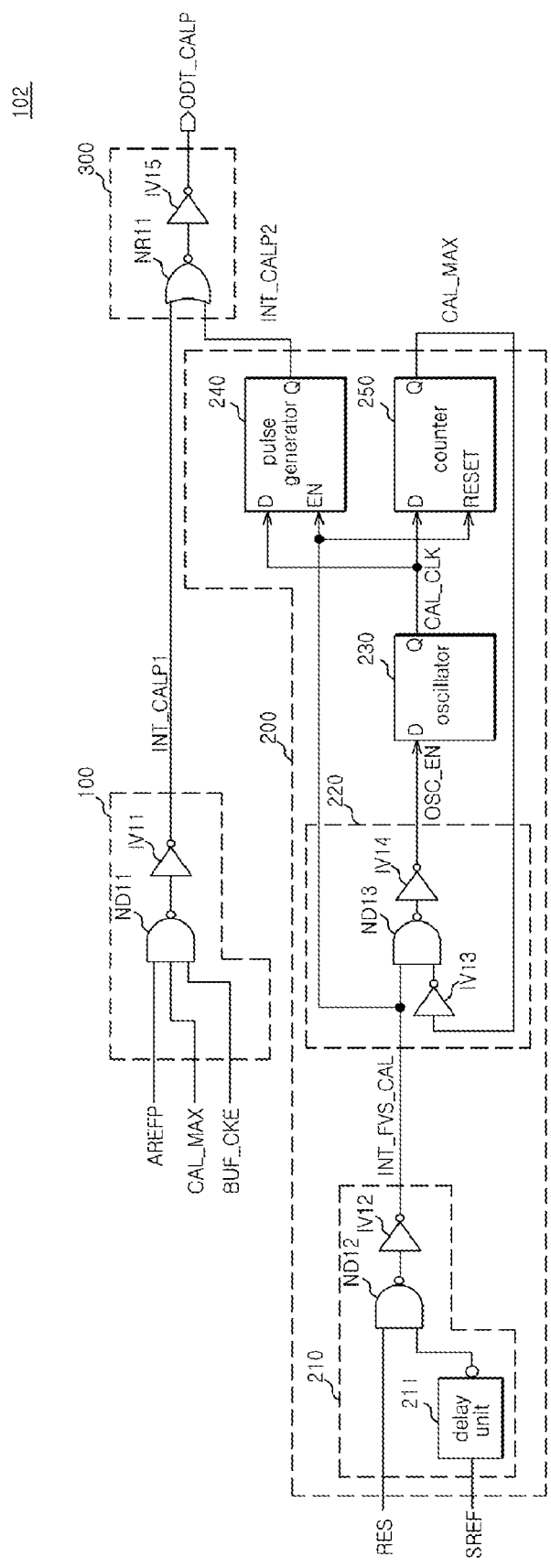
FIG. 4 is a circuit diagram illustrating a circuit configured to generate an on-die termination control signal according to another embodiment.

FIG. 4 is a circuit diagram illustrating a circuit 102 configured to generate an on-die termination control signal according to another embodiment. As shown in FIG. 4, for circuit 102, the first signal generation block 100 can include a NAND gate ND11, which can receive the counting limit signal (CAL_MAX), the clock enable signal (BUF_CKE) and an auto-refresh pulse signal (AREFP), and an inverter IV11 configured to receive the output of the NAND gate ND11. As shown in FIG. 4, the second signal generation block 200 can include a timing controller 210, a driver 220, an oscillator 230, a pulse generator 240 and a counter 250.

The timing controller 210 can generate a timing signal (INT_FVS_CAL). Then after the predetermined time passes, the self-refresh period ends. The timing controller 210 can include a delay unit 211, a NAND gate ND12 and an inverter IV12 configured to receive the output of the NAND gate ND12. The delay unit 211 can delay and invert the self-refresh signal (SREF) and then output the inverted self-refresh signal (SREF). The NAND gate ND12 can receive the system stabilizing signal (RES) and the output of the delay unit 211.

The driver 220 can output a driving signal (OSC_EN) according to the timing signal (INT_FVS_CAL) and the counting limit signal (CAL_MAX). The driver 220 can include a first inverter IV13 configured to receive the counting limit signal (CAL_MAX), a NAND gate ND13 configured to receive the timing signal (INT_FVS_CAL) and the output of the first inverter IV13 and a second inverter IV14 configured to receive the NAND gate ND13.

The oscillator 230 can generate a control signal generation clock (CAL_CLK) according to the driving signal (OSC_EN). The pulse generator 240 can generate a repetitive pulse as the second internal signal (INT_CALP2), according to the control signal generation clock (CAL_CLK). The pulse generator 240 can start a pulse generation operation when the timing signal (INT_FVS_CAL) is activated.

The counter 250 can count the number of control signal generation clocks (CAL_CLK). When the number of the control signal generation clocks (CAL_CLK) reaches a predetermined level, the counter 250 can activate the counting limit signal (CAL_MAX) and then output the activated counting limit signal (CAL_MAX). When the timing signal (INT_FVS_CAL) is deactivated, the counter 250 can reset the counting limit signal (CAL_MAX) to an initial value.

As shown in FIG. 4, the signal output block 300 can include a NOR gate NR11 configured to receive the first internal signal (INT_CALP1) and the second internal signal (INT_CALP2) and an inverter IV15.

Figure 5:
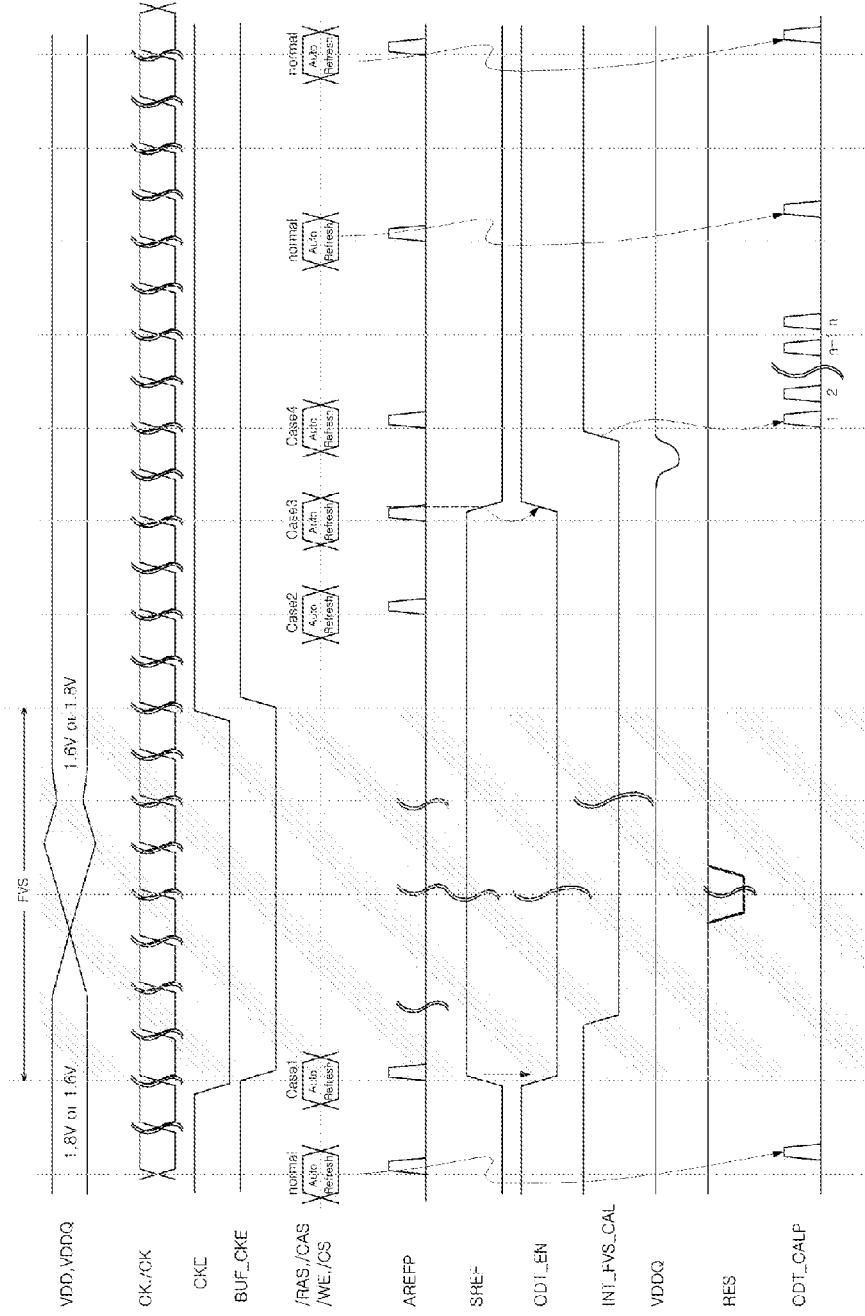
FIG. 5 is a timing diagram illustrating the operation of the circuit of FIGS. 3 and 4.

FIG. 5 is a timing diagram illustrating an operation of circuit 101 or 102. As can be seen, as the system stabilizing signal (RES) is activated from a low level into a high level during the initial operation of the semiconductor memory apparatus, the on-die termination control can be performed several times according to the counting limit signal (CAL_MAX). Meanwhile, after the initial operation, a one-time on-die termination control can be performed according to the auto-refresh pulse signal (AREFP).

Hereinafter, the one-time on-die termination control will be referred to as a first on-die termination control and the on-die termination control performed several times will be referred to as a second on-die termination control. The system stabilizing signal (RES) can inform the semiconductor memory device of a stable operation state in which a stable clock signal outputs can be issued from a GPU (graphic processing unit) or a CPU (central processing unit) that can control the semiconductor memory. Further, the counting limit signal (CAL_MAX) can be activated when the counter 250 counts a predetermined counting number. During the initial operation of the semiconductor memory apparatus, the counting limit signal (CAL_MAX) is deactivated in a low level.

As shown in FIG. 5, when the auto-refresh pulse signal (AREFP) is generated according to the auto-refresh command during a normal period, the first internal signal (INT_CALP1) can be generated since the clock enable signal (BUF_CKE) and the counting limit signal (CAL_MAX) are in an activated state. Then, the first internal signal (INT_CALP1) can be output as the on-die termination control signal (ODT_CALP) through the signal output block 300 so that the first on-die termination control can be performed. The counting limit signal (CAL_MAX) can be activated in a high level according to the second on-die termination control during the initial operation of the semiconductor memory apparatus.

When the auto-refresh pulse signal (AREFP) is generated, in a self-refresh period where the self-refresh signal is activated, as shown in the case 1, since the clock enable signal (BUF_CKE) is deactivated, the first internal signal (INT_CALP1) is not generated. That is, the first on-die termination control can be prevented from being performed in the self-refresh period by means of the clock enable signal (BUF_CKE).

In the semiconductor memory apparatus, a frequency/voltage switching (FVS) period can exist in the self-refresh period where the self-refresh signal (SREF) is activated. The FVS period can be for switching voltage or frequency to save power consumption according to the operational mode change. Since the voltage or the frequency can be switched in the FVS period, the voltage or the frequency can be unstable in the FVS period.

As described above, since the voltage or the frequency is unstable in the FVS period, the system stabilizing signal (RES) can be temporarily deactivated and then activated again in the FVS period.

According to the prior art, if the system stabilizing signal (RES) is activated, then the second internal signal (INT_CALP2) can be generated so that the second on-die termination control is performed. However, according to one embodiment, since the self-refresh signal (SREF) is activated, a generation of the second internal signal (INT_CALP2) can be blocked so that the second on-die termination control is not performed.

When the auto-refresh pulse signal (AREFP) is generated in a state in which the self-refresh period is not ended yet, as shown in the case 2, although the clock enable signal (BUF_CKE) is activated, the counting limit signal (CAL_MAX), which is reset into a low level due to the timing signal (INT_FVS_CAL), can block the first internal signal (INT_CALP1). That is, the first on-die termination control can be prevented from being performed in the self-refresh period by means of the counting limit signal (CAL_MAX).

If the auto-refresh pulse signal (AREFP) is generated when the self-refresh period is ended, as shown in the case 3, although the clock enable signal (BUF_CKE) is activated, then the counting limit signal (CAL_MAX), which is reset into a low level due to the timing signal (INT_FVS_CAL), blocks the first internal signal (INT_CALP1). That is, although the self-refresh signal is deactivated in a low level due to the termination of the self-refresh period, the activation of the timing signal (INT_FVS_CAL) is delayed by means of the delay unit 211 shown in FIG. 4. A conflict of the first internal signal (INT_CALP1) and the second internal signal (INT_CALP2) may be prevented using the counting limit signal (CAL_MAX) and the delay unit 211. The first internal signal (INT_CALP1) may be derived from the auto-refresh pulse signal (AREFP) and the second internal signal (INT_CALP2) may be derived from the self-refresh signal (SREF).

When the auto-refresh pulse signal (AREFP) is generated after the self-refresh period ends as shown in the case 4, the counting limit signal (CAL_MAX), which is in a reset state, may block the first internal signal (INT_CALP1).

If the self-refresh period ends, that is, if the self-refresh signal (SREF) is deactivated in a low level, then the timing signal (INT_FVS_CAL) can be activated with the lapse of a delay time of the delay unit 211. When the timing signal (INT_FVS_CAL) is activated, the oscillator 230 can be operated so that the control signal generating clock (CAL_CLK) is generated. Thus, the pulse generator 240 can be operated, thereby generating the second internal signal (INT_CALP2). Therefore, the second internal signal (INT_CALP2) can be output as the on-die termination control signal (ODT_CALP)

through the signal output block 300 so that the second on-die termination control is performed.

The enable signal (ODT_EN) can be activated as the self-refresh period ends, and thus the on-die termination circuit can be operated to perform the on-die termination control. In this case, the supply voltage VDDQ may be temporarily dropped. Similarly to the self-refresh period, the on-die termination control may not be normally performed in the supply voltage drop period. In one embodiment, the delay unit 211 is employed and is configured to enable the normal on-die termination control by delaying a time such that the supply voltage VDDQ can return to a normal level.

In addition, according to the related art, the first on-die termination control is performed at the end of the self-refresh period. However, according to one embodiment, since the voltage or the frequency can be changed in the self-refresh period and the supply voltage VDDQ can be temporarily dropped, the second on-die termination control can be performed by taking the above conditions into consideration.

Meanwhile, the counter 250 can count the number of the second internal signals (INT_CALP2) of the pulse generator 240, that is, the number of pulse s generation by using the control signal generating clock (CAL_CLK). If the count value reaches a predetermined level (for instance, 30), then the counter 250 can activate the counting limit signal (CAL_MAX) in a high level.

As the counting limit signal (CAL_MAX) is activated in a high level, the oscillator enable signal (OSC_EN) output from the driver 220 can be deactivated. When the oscillator enable signal (OSC_EN) is deactivated, the oscillator 230 does not generate the control signal generating clock (CAL_CLK), and therefore the pulse generator 240 does not generate the second internal signal (INT_CALP2).

As described above, the circuit for generating the on-die termination control signal can have the following advantages. First, the abnormal on-die termination control derived from the unstable operating condition can be prevented. Second, the abnormal on-die termination control signal caused by the collision between the on-die termination control signals can be prevented so that the on-die termination control can be stably performed. Third, since the on-die termination control can be performed several times after the self-refresh period ends, the accuracy of the on-die termination control can be improved based on the variation in voltage and frequency.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A circuit for generating an on-die termination control signal, the circuit comprising:
   a first signal generation block for generating a first signal to prevent a first on-die terminal control from being performed in a frequency/voltage switching period;
   a second signal generation block for generating a second signal to perform a second on-die termination control at an initial stage of operation when a system stabilizing signal is activated in a state in which a self-refresh signal is deactivated; and
   a signal output block for generating the on-die termination control signal by combining the first and second signals.

2. The circuit of claim 1, wherein the frequency/voltage switching period includes a self-refresh period.

3. The circuit of claim 2, wherein the frequency/voltage switching period further includes a predetermined time period after the self-refresh period ends.

4. The circuit of claim 3, wherein the first signal generation block is configured to generate the first signal by detecting the self-refresh period and the predetermined time period using a counting limit signal and a clock enable signal.

5. The circuit of claim 1, wherein the first signal generation block is configured to generate the first signal when an auto-refresh signal is generated in a state in which a counting limit signal and a clock enable signal are activated.

6. The circuit of claim 1, wherein the signal output block includes a circuit that outputs a signal by OR operating the first and second signals.

7. The circuit of claim 1, wherein an on-die termination control is performed one time in the first on-die termination control.

8. The circuit of claim 1, wherein an on-die termination control is performed several times in the second on-die termination control.

9. A circuit for generating an on-die termination control signal, the circuit comprising:
   a first signal generation block for generating a first signal to perform a first on-die terminal control according to a self refresh signal or an auto-refresh signal;
   a second signal generation block for generating a second signal to prevent a second on-die termination control from being performed in a frequency/voltage switching period and to perform the second on-die termination control after the frequency/voltage switching period ends; and
   a signal output block for generating the on-die termination control signal by combining the first and second signals,
   wherein the second signal generation block generates the second signal by using a system stabilizing signal and the self-refresh signal.

10. The circuit of claim 9, wherein the frequency/voltage switching period includes a self-refresh period.

11. The circuit of claim 9, wherein the second signal generation block generates the second signal by repeatedly generating pulses when the system stabilizing signal is activated in a state in which the self-refresh signal is deactivated, and stops generation of the second signal when a predetermined number of pulses are generated.

12. The circuit of claim 9, wherein the signal output block includes a circuit that outputs a signal by OR operating the first and second signals.

13. The circuit of claim 9, wherein an on-die termination control is performed one time in the first on-die termination control.

14. The circuit of claim 9, wherein an on-die termination control is performed several times in the second on-die termination control.

15. A circuit for generating an on-die termination control signal, the circuit comprising:
   a first signal generation block for generating a first signal to prevent a first on-die termination control from being performed in a frequency/voltage switching period;
   a second signal generation block for generating a second signal to prevent a second on-die termination control from being performed in the frequency/voltage switching period and to perform the second on-die termination control after the frequency/voltage switching period ends; and
   a signal output block for generating the on-die termination control signal by combining the first and second signals, wherein the second signal generation block generates the second signal by using a system stabilizing signal and a self-refresh signal.

16. The circuit of claim 15, wherein the frequency/voltage switching period includes a self-refresh period.

17. The circuit of claim 16, wherein the frequency/voltage switching period further includes a predetermined time period after the self refresh period ends.

18. The circuit of claim 15, wherein the first signal generation block is configured to generate the first signal when an auto-refresh signal is generated in a state in which a counting limit signal and a clock enable signal are activated.

19. The circuit of claim 15, wherein the second signal generation block is configured to generate the second signal by repeatedly generating pulses when the system stabilizing signal is activated in a state in which the self-refresh signal is deactivated, and stops generation of the second signal when a predetermined number of pulses are generated.

20. The circuit of claim 19, wherein the second signal generation block includes:

a timing controller that generates a timing signal when a predetermined time lapses after the self-refresh period ends;

a driver that outputs a driving signal based on the timing signal and the counting limit signal;

an oscillator that generates clocks according to the driving signal;

a pulse generator that outputs the second signal by generating pulses according to the clocks; and a counter that counts a number of clocks to output the counting limit signal.

21. The circuit of claim 20, wherein the driver includes a logic circuit that outputs a signal by AND operating an output of the timing controller and the counting limit signal.

22. The circuit of claim 15, wherein the signal output block includes a logic circuit that outputs a signal by OR operating the first signal and the second signal.

23. The circuit of claim 15, wherein an on-die termination control is performed one time in the first on-die termination control and is performed several times in the second on-die termination control.

* * * * *